United States Patent
Kataya et al.

(10) Patent No.: US 7,830,311 B2
(45) Date of Patent: Nov. 9, 2010

(54) WIRELESS IC DEVICE AND ELECTRONIC DEVICE

(75) Inventors: Takeshi Kataya, Ritto (JP); Noboru Kato, Moriyama (JP); Satoshi Ishino, Kusatsu (JP); Nobuo Ikemoto, Moriyama (JP); Ikuhei Kimura, Nara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 582 days.

(21) Appl. No.: 11/851,661

(22) Filed: Sep. 7, 2007

(65) Prior Publication Data
US 2009/0021446 A1    Jan. 22, 2009

(30) Foreign Application Priority Data
Jul. 18, 2007    (JP)    ............................. 2007-186392

(51) Int. Cl.
*H01Q 1/38* (2006.01)
(52) U.S. Cl. .................. 343/700 MS; 343/895
(58) Field of Classification Search .......... 343/700 MS, 343/702, 895
See application file for complete search history.

(56) References Cited

U.S. PATENT DOCUMENTS

| | | | |
|---|---|---|---|
| 3,364,564 A | 1/1968 | Kurtz et al. | |
| 4,794,397 A | 12/1988 | Ohe et al. | |
| 5,232,765 A | 8/1993 | Yano et al. | |
| 5,253,969 A | 10/1993 | Richert | |
| 5,337,063 A | 8/1994 | Takahira | |
| 5,374,937 A | 12/1994 | Tsunekawa et al. | |
| 5,399,060 A | 3/1995 | Richert | |
| 5,491,483 A | 2/1996 | D'Hont | |
| 5,757,074 A | 5/1998 | Matloubian et al. | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,311 A | 8/2000 | Lastinger | |
| 6,107,920 A | 8/2000 | Eberhardt et al. | |

(Continued)

FOREIGN PATENT DOCUMENTS

| | | |
|---|---|---|
| EP | 0 977 145 A2 | 2/2000 |
| JP | 50-143451 A | 11/1975 |
| JP | 62-127140 U | 8/1987 |
| JP | 05-327331 A | 12/1993 |
| JP | 6-53733 A | 2/1994 |

(Continued)

OTHER PUBLICATIONS

Official communication issued in Japanese Application No. 2007-531524, mailed on Sep. 11, 2007.

(Continued)

*Primary Examiner*—HoangAnh T Le
(74) *Attorney, Agent, or Firm*—Keating & Bennett, LLP

(57) ABSTRACT

A wireless IC device includes a wireless IC chip for processing a transmission/reception signal, a printed wiring circuit board on which the wireless IC chip is mounted, a ground electrode disposed on the circuit board, and a substantially loop-shaped electrode that is electrically conducted to the wireless IC chip and disposed on the circuit board so as to be coupled to the ground electrode by an electromagnetic field. The ground electrode is coupled to the wireless IC chip via the substantially loop-shaped electrode to transmit/receive a radio frequency signal. A feeder circuit board including a resonant circuit and/or a matching circuit may be interposed between the wireless IC chip and the substantially loop-shaped electrode.

16 Claims, 12 Drawing Sheets

U.S. PATENT DOCUMENTS

| | | |
|---|---|---|
| 6,172,608 B1 | 1/2001 | Cole |
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2004/0001027 A1 | 1/2004 | Killen et al. |
| 2004/0125040 A1* | 7/2004 | Ferguson et al. ............ 343/895 |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0001785 A1* | 1/2005 | Ferguson et al. ............ 343/895 |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0054710 A1* | 3/2006 | Forster et al. ............... 235/492 |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0252700 A1 | 11/2007 | Ishihara et al. |
| 2007/0285335 A1 | 12/2007 | Bungo et al. |
| 2008/0024156 A1 | 1/2008 | Arai et al. |
| 2008/0169905 A1 | 7/2008 | Slatter |
| 2008/0272885 A1 | 11/2008 | Atherton |
| 2008/0316115 A1* | 12/2008 | Hill et al. .................... 343/702 |
| 2009/0002130 A1 | 1/2009 | Kato |

FOREIGN PATENT DOCUMENTS

| | | | |
|---|---|---|---|
| JP | 06-077729 A | 3/1994 | |
| JP | 06-177635 A | 6/1994 | |
| JP | 07-183836 A | 7/1995 | |
| JP | 08-056113 A | 2/1996 | |
| JP | 8-87580 A | 4/1996 | |
| JP | 11-149537 A | 6/1996 | |
| JP | 08-279027 A | 10/1996 | |
| JP | 08-307126 A | 11/1996 | |
| JP | 08-330372 A | 12/1996 | |
| JP | 09-014150 A | 1/1997 | |
| JP | 09-245381 A | 9/1997 | |
| JP | 09-252217 A | 9/1997 | |
| JP | 09-270623 A | 10/1997 | |
| JP | 10-505466 A | 5/1998 | |
| JP | 10-171954 A | 6/1998 | |
| JP | 10-293828 A | 11/1998 | |
| JP | 11-149538 A | 6/1999 | |
| JP | 11-175678 A | 7/1999 | |
| JP | 11-219420 A | 8/1999 | |
| JP | 11-328352 A | 11/1999 | |
| JP | 11-346114 A | 12/1999 | |
| JP | 11-515094 A | 12/1999 | |
| JP | 2000-21128 A | 1/2000 | |
| JP | 2000-021639 A | 1/2000 | |
| JP | 2000-022421 A | 1/2000 | |
| JP | 2005-229474 A | 1/2000 | |
| JP | 2000-059260 A | 2/2000 | |
| JP | 2000-085283 A | 3/2000 | |
| JP | 2000-132643 A | 5/2000 | |
| JP | 2000-137778 A | 5/2000 | |
| JP | 2000-148948 A | 5/2000 | |
| JP | 2000-172812 A | 6/2000 | |
| JP | 2000-510271 A | 8/2000 | |
| JP | 2000-276569 A | 10/2000 | |
| JP | 2000-286634 A | 10/2000 | |
| JP | 2000-286760 A | 10/2000 | |
| JP | 2000-311226 A | 11/2000 | |
| JP | 2000-321984 A | 11/2000 | |
| JP | 2001-028036 A | 1/2001 | |
| JP | 2007-18067 A | 1/2001 | |
| JP | 2001-66990 A | 3/2001 | |
| JP | 2001-168628 A | 6/2001 | |
| JP | 2001-256457 A | 9/2001 | |
| JP | 2001-514777 A | 9/2001 | |
| JP | 2001-319380 A | 11/2001 | |
| JP | 2001-331976 A | 11/2001 | |
| JP | 2001-332923 A | 11/2001 | |
| JP | 2001-344574 A | 12/2001 | |
| JP | 2001-351084 A | 12/2001 | |
| JP | 2002-024776 A | 1/2002 | |
| JP | 2002-042076 A | 2/2002 | |
| JP | 2002-505645 A | 2/2002 | |
| JP | 2002-76750 A | 3/2002 | |
| JP | 2002-150245 A | 5/2002 | |
| JP | 2002-175508 A | 6/2002 | |
| JP | 2002-183690 A | 6/2002 | |
| JP | 2002-185358 A | 6/2002 | |
| JP | 2002-204117 A | 7/2002 | |
| JP | 2002-230128 A | 8/2002 | |
| JP | 2002-298109 A | 10/2002 | |
| JP | 2002-319008 A | 10/2002 | |
| JP | 2002-362613 A | 12/2002 | |
| JP | 2002-373029 A | 12/2002 | |
| JP | 2002-373323 A | 12/2002 | |
| JP | 2003-016412 A | 1/2003 | |
| JP | 2003-030612 A | 1/2003 | |
| JP | 2003-44789 A | 2/2003 | |
| JP | 2003-58840 A | 2/2003 | |
| JP | 2003-067711 A | 3/2003 | |
| JP | 2003-076947 A | 3/2003 | |
| JP | 2003-085501 A | 3/2003 | |
| JP | 2003-085520 A | 3/2003 | |
| JP | 2003-87008 A | 3/2003 | |
| JP | 2003-87044 A | 3/2003 | |
| JP | 2003-099720 A | 4/2003 | |
| JP | 2003-099721 A | 4/2003 | |
| JP | 2003-110344 A | 4/2003 | |
| JP | 2003-132330 A | 5/2003 | |

| | | | |
|---|---|---|---|
| JP | 2003-134007 A | 5/2003 | |
| JP | 2003-155062 A | 5/2003 | |
| JP | 2003-158414 A | 5/2003 | |
| JP | 2003-187207 A | 7/2003 | |
| JP | 2003-187211 A | 7/2003 | |
| JP | 2003-198230 A | 7/2003 | |
| JP | 2003-209421 A | 7/2003 | |
| JP | 2003-218624 A | 7/2003 | |
| JP | 2003-233780 A | 8/2003 | |
| JP | 2003-242471 A | 8/2003 | |
| JP | 2003-243918 A | 8/2003 | |
| JP | 2003-288560 A | 10/2003 | |
| JP | 2003-309418 A | 10/2003 | |
| JP | 2003-332820 A | 11/2003 | |
| JP | 2004-88218 A | 3/2004 | |
| JP | 2004-096566 A | 3/2004 | |
| JP | 2004-253858 A | 9/2004 | |
| JP | 2004-287767 A | 10/2004 | |
| JP | 2004-297249 A | 10/2004 | |
| JP | 2004-326380 A | 11/2004 | |
| JP | 2004-334268 A | 11/2004 | |
| JP | 2004-336250 A | 11/2004 | |
| JP | 2004-343000 A | 12/2004 | |
| JP | 2004-362190 A | 12/2004 | |
| JP | 2004-362341 A | 12/2004 | |
| JP | 2004-362602 A | 12/2004 | |
| JP | 2005-136528 A | 5/2005 | |
| JP | 2005-165839 A | 6/2005 | |
| JP | 2005-167327 A | 6/2005 | |
| JP | 2005-191705 A | 7/2005 | |
| JP | 2005-210676 A | 8/2005 | |
| JP | 2005-210680 A | 8/2005 | |
| JP | 2005-217822 A | 8/2005 | |
| JP | 2005-229474 A | 8/2005 | |
| JP | 2005-236339 A | 9/2005 | |
| JP | 2005-244778 A | 9/2005 | |
| JP | 2005-275870 A | 10/2005 | |
| JP | 2005-295135 A | 10/2005 | |
| JP | 2005-311205 A | 11/2005 | |
| JP | 2005-321305 A | 11/2005 | |
| JP | 2005-335755 A | 12/2005 | |
| JP | 2005-346820 A | 12/2005 | |
| JP | 2005-352858 A | 12/2005 | |
| JP | 2006-031766 A | 2/2006 | |
| JP | 2006-39902 A | 2/2006 | |
| JP | 2006-67479 A | 3/2006 | |
| JP | 2006-72706 A | 3/2006 | |
| JP | 2006-80367 A | 3/2006 | |
| JP | 2006-92630 A | 4/2006 | |
| JP | 2006-102953 A | 4/2006 | |
| JP | 2006-148518 A | 6/2006 | |
| JP | 2006-195795 A | 7/2006 | |
| JP | 2006-270212 A | 10/2006 | |
| JP | 2006-309401 A | 11/2006 | |
| JP | 2007-65822 A | 3/2007 | |
| JP | 2007-150868 A | 6/2007 | |
| JP | 11-175678 A | 1/2009 | |
| NL | 9100176 A | 3/1992 | |
| NL | 9100347 A | 3/1992 | |
| WO | 03/079305 A1 | 9/2003 | |
| WO | 2004/036772 A1 | 4/2004 | |
| WO | 2004/070879 A | 8/2004 | |
| WO | 2004/072892 A1 | 8/2004 | |
| WO | 2005/073937 A | 8/2005 | |
| WO | 2005/115849 A1 | 12/2005 | |
| WO | 2006/045682 A | 5/2006 | |

OTHER PUBLICATIONS

Official communication issued in Japanese Application No. 2007-531525, mailed on Sep. 25, 2007.

Official communication issued in Japanese Application No. 2007-531524, mailed on Dec. 12, 2007.

Official communication issued in European Application No. 07706650.4, mailed on Nov. 24, 2008.

Mukku-Sha, "Musen IC Tagu Katsuyo-no Subete" "(All About Wireless IC Tags"), RFID, pp. 112-126.

English translation of NL9100176, published on Mar. 2, 1992.

English translation of NL9100347, published on Mar. 2, 1992.

Dokai et al.: "Wireless IC Device and Component for Wireless IC Device," U.S. Appl. No. 11/624,382; filed on Jan. 18, 2007.

Dokai et al.: "Wireless IC Device, and Component for Wireless IC Device," U.S. Appl. No. 11/930,818; filed on Oct. 31, 2007.

Kato et al.: "Wireless IC Device," U.S. Appl. No. 12/042,399; filed on Mar. 5, 2008.

Official communication issued in related U.S. Appl. No. 12/042,399; mailed on Aug. 25, 2008.

Kato et al.: "Wireless IC Device and Component for Wireless IC Device," U.S. Appl. No. 12/339,198; filed on Dec. 19, 2008.

Ikemoto et al.: "Wireless IC Device," U.S. Appl. No. 11/851,651; filed on Sep. 7, 2007.

Dokai et al.: "Wireless IC Device and Component for Wireless IC Device," U.S. Appl. No. 12/359,690; filed on Jan. 26, 2009.

Dokai et al.: "Antenna and Radio IC Device,"U.S. Appl. No. 12/350,307; filed on Jan. 8, 2009.

Kato et al.: "Antenna," U.S. Appl. No. 11/928,502; filed on Oct. 30, 2007.

Kato et al.: Wireless IC Device, U.S. Appl. No. 12/211,117; filed on Sep. 16, 2008.

Kato et al.: "Antenna," U.S. Appl. No. 11/688,290; filed on Mar. 20, 2007.

Kato et al.: "Electromagnetic-Coupling-Module-Attached Article," U.S. Appl. No. 11/740,509; filed on Apr. 26, 2007.

Kato et al.: "Product Including Power Supply Circuit Board," U.S. Appl. No. 12/234,949; filed on Sep. 22, 2008.

Kato et al.: "Data Coupler," U.S. Appl. No. 12/252,475; filed on Oct. 16, 2008.

Kato et al.; "Information Terminal Device," U.S. Appl. No. 12/267,666; filed on Nov. 10, 2008.

Kato et al.: "Wireless IC Device and Wireless IC Device Composite Component," U.S. Appl. No. 12/276,444; filed on Nov. 24, 2008.

Dokai et al.: "Optical Disc," U.S. Appl. No. 12/326,916; filed on Dec. 3, 2008.

Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400; filed on Nov. 20, 2008.

Kato: "Wireless IC Device,"U.S. Appl. No. 11/964,185; filed on Dec. 26, 2007.

Kato et al.: "Radio Frequency IC Device," U.S. Appl. No. 12/336,629; filed Dec. 17, 2008.

* cited by examiner

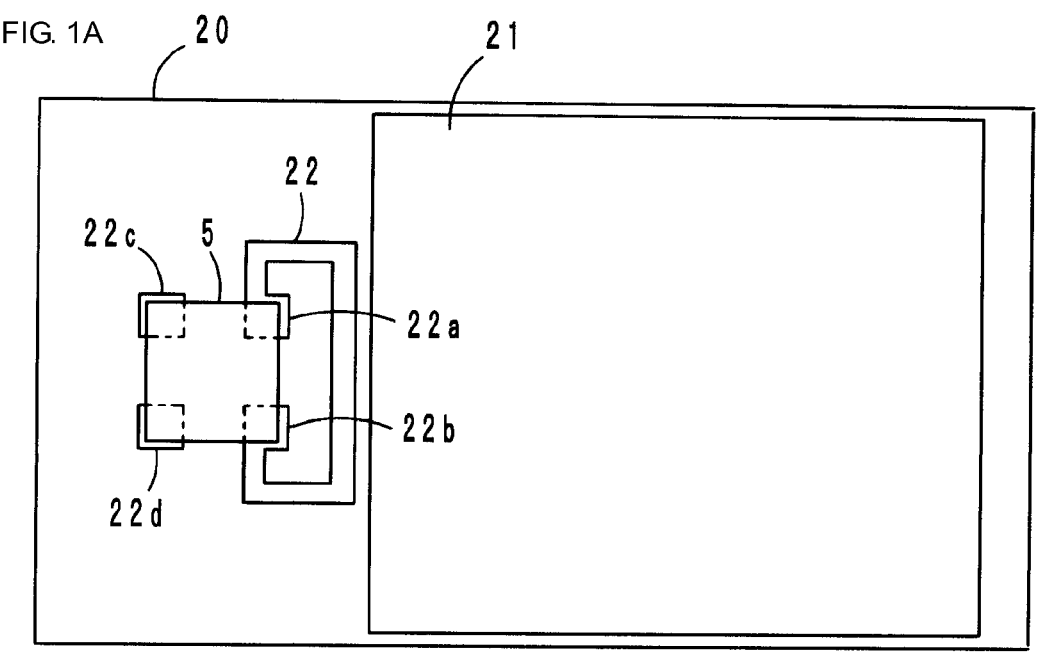
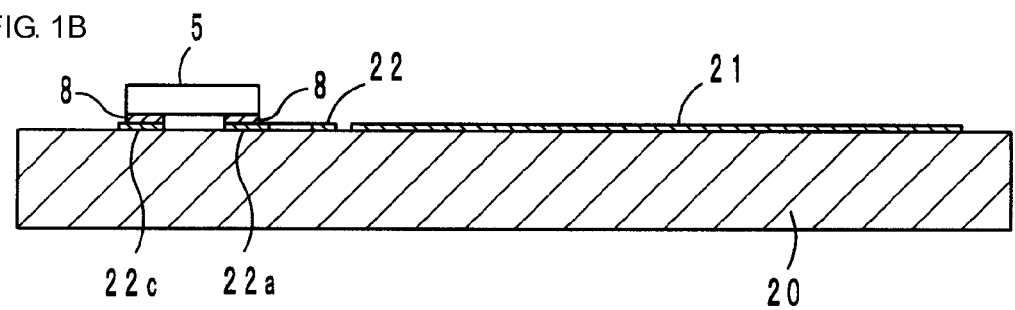

WIRELESS IC DEVICE AND ELECTRONIC DEVICE

BACKGROUND OF THE INVENTION

1. Field of the Invention

The present invention relates to a wireless IC device, and more specifically to a wireless IC device having a wireless IC chip used in an RFID (Radio Frequency Identification) system, and an electronic apparatus including the wireless IC device.

2. Description of the Related Art

In recent years, an RFID system has been developed as an item management system, in which communication is performed in a non-contact manner between a reader/writer that generates an induction field, and an IC chip (also referred to as the IC tag or wireless IC chip) storing predetermined information and attached to an item, a container, or the like to thereby transmit information.

PCT Japanese Translation Patent Publication No. 11-515094 describes an RFID tag including an IC chip and an antenna formed within a printed wiring circuit board. In this RFID tag, the antenna within the printed wiring circuit board and the IC chip mounted on the principal surface of that board are connected to each other in an electrically conductive state. Miniaturization of the RFID tag is achieved by arranging the antenna within the printed wiring circuit board.

However, since this RFID tag includes a dedicated antenna, an antenna fabrication process is required, leading to an increase in cost. Further, an installation space for the antenna is also required, resulting in an increase in size. In particular, if the antenna is formed in a substantially meandering shape as depicted in FIG. 2 of PCT Japanese Translation Patent Publication No. 11-515094, it is necessary to machine inner electrodes across a plurality of layers, which elongates the fabrication process. Further, a matching part for matching the impedance between the IC chip and the antenna is required. In this case, if the matching part is provided at the connecting part between the antenna and the IC chip, the antenna is enlarged, and if the IC chip is changed, it is necessary to change the shape of the antenna or the like as well.

SUMMARY OF THE INVENTION

Preferred embodiments of the present invention provide a wireless IC device which does not require a dedicated antenna and hence makes it possible to achieve miniaturization and which also allows easy impedance matching, and an electronic apparatus including the wireless IC device.

According to a first preferred embodiment of the present invention, a wireless IC device includes a wireless IC chip for processing a transmission/reception signal; a circuit board on which the wireless IC chip is mounted; a ground electrode disposed on the circuit board; and a substantially loop-shaped electrode that is electrically conducted to the wireless IC chip, and disposed on the circuit board so as to be coupled to the ground electrode.

According to a second preferred embodiment of the present invention, a wireless IC device includes an electromagnetic coupling module having a wireless IC chip for processing a transmission/reception signal, and a feeder circuit board including an inductance element, the inductance element being connected to the wireless IC chip in an electrically conductive state; a circuit board on which the electromagnetic coupling module is mounted; a ground electrode disposed on the circuit board; and a substantially loop-shaped electrode that is electrically conducted to the feeder circuit board, and disposed on the circuit board so as to be coupled to the ground electrode.

In the wireless IC device according to the first and second preferred embodiments of the present invention, the wireless IC chip or the feeder circuit board and the ground electrode are coupled to each other via the substantially loop-shaped electrode, and the ground electrode functions as a radiator plate (antenna) of the wireless IC chip. That is, the wireless IC chip is operated via the substantially loop-shaped electrode by a signal received by the ground electrode, and a response signal from the wireless IC chip is radiated from the ground electrode to the outside via the substantially loop-shaped electrode. Therefore, it is not necessary to fabricate a dedicated antenna, nor is it necessary to provide a space for installation of that antenna. Further, the substantially loop-shaped electrode can provide impedance matching between the wireless IC chip and the ground electrode, and hence it is unnecessary to provide a separate matching part, thereby improving the efficiency of signal transmission between the wireless IC chip and the ground electrode.

In the wireless IC device according to the second preferred embodiment of the present invention, the feeder circuit board is interposed between the wireless IC chip and the substantially loop-shaped electrode. This feeder circuit board includes a resonant circuit and/or a matching circuit having an inductance element, and the frequency to be used is set by the resonant circuit and/or the matching circuit. When the wireless IC chip is changed in accordance with the frequency used by the RFID system, it suffices to change only the design of the resonant circuit and/or the matching circuit, and there is no need to change the shape, size, or arrangement of the radiator plate (ground electrode) or the coupling state between the substantially loop-shaped electrode and the ground electrode or the feeder circuit board. Further, the resonant circuit and/or the matching circuit can also include a function of matching the impedance between the wireless IC chip and the ground electrode, thereby making it possible to improve the efficiency of signal transmission between the wireless IC chip and the ground electrode.

It should be noted that other than storing various kinds of information related to an item to which the wireless IC device is to be attached, the wireless IC chip may allow rewriting of information, or may have an information processing function other than the RFID system.

According to a preferred embodiment of the present invention, an existing ground electrode on the circuit board can be used as an antenna, and it is thus unnecessary to arrange an antenna as a separate component, thereby achieving miniaturization of the wireless IC device or the apparatus with the wireless IC device installed. Further, an impedance matching function can be imparted to the resonant circuit and/or the matching circuit included in the substantially loop-shaped electrode and/or the feeder circuit board, thus eliminating the need to separately provide a matching part.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 1A and 1B show a wireless IC device according to a first preferred embodiment of the present invention, of which FIG. 1A is a plan view, and FIG. 1B is a sectional view taken along the long-side direction.

FIGS. 3A and 3B show a wireless IC device according to a second preferred embodiment of the present invention, of which FIG. 3A is a plan view, and FIG. 3B is a sectional view taken along the long-side direction.

FIGS. 4A to 4C show a wireless IC device according to a third preferred embodiment of the present invention, of which FIG. 4A is a plan view, FIG. 4B is a sectional view taken along the long-side direction, and FIG. 4C is a sectional view taken along the short-side direction.

FIGS. 5A and 5B show a wireless IC device according to a fourth preferred embodiment of the present invention, of which FIG. 5A is a plan view, and FIG. 5B is a sectional view taken along the long-side direction.

FIGS. 6A to 6C show a wireless IC device according to a fifth preferred embodiment of the present invention, of which FIG. 6A is a plan view, FIG. 6B is a sectional view taken along the long-side direction, and FIG. 6C is a sectional view taken along the short-side direction.

FIGS. 7A and 7B show a wireless IC device according to a sixth preferred embodiment of the present invention, of which FIG. 7A is a plan view, and FIG. 7B is a sectional view taken along the long-side direction.

FIGS. 8A and 8B show a wireless IC device according to a seventh preferred embodiment of the present invention, of which FIG. 8A is a plan view, and FIG. 8B is a sectional view taken along the long-side direction.

DETAILED DESCRIPTION OF PREFERRED EMBODIMENTS

Figure 2:
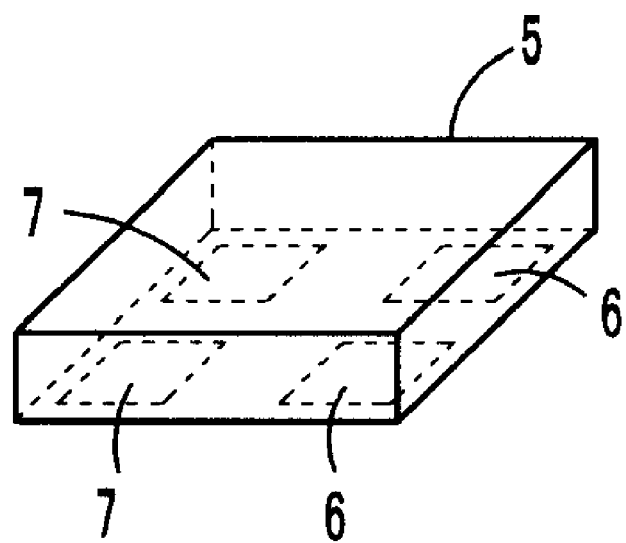
FIG. 2 is a perspective view showing a wireless IC chip.

Hereinbelow, a wireless IC device and an electronic apparatus according to preferred embodiments of the present invention will be described with reference to the accompanying drawings. It should be noted that in the drawings, common elements and portions are denoted by the same reference numerals, and description thereof is not repeated.

First Preferred Embodiment

FIGS. 1A and 1B and FIG. 2

FIGS. 1A and 1B show a wireless IC device according to a first preferred embodiment of the present invention. This wireless IC device includes a wireless IC chip 5 for processing a transmission/reception signal of a predetermined frequency, a printed wiring circuit board 20 on which the wireless IC chip 5 is mounted, and a ground electrode 21 and a substantially loop-shaped electrode 22 that are disposed on the circuit board 20. The ground electrode 21 and the substantially loop-shaped electrode 22 are provided on the principal surface of the printed wiring circuit board 20 through application of a conductive paste, etching of a metal foil provided on the circuit board 20, or the like.

The wireless IC chip 5 preferably includes a clock circuit, a logic circuit, a memory circuit, and the like, and stores necessary information. As shown in FIG. 2, the wireless IC chip 5 has input/output terminal electrodes 6, 6 and mounting terminal electrodes 7, 7 provided on its back surface. The input/output terminal electrodes 6, 6 are electrically connected via a metal bump 8 to connection electrodes 22a, 22b provided at opposite ends of the substantially loop-shaped electrode 22. A pair of connection electrodes 22c, 22d are provided on the circuit board 20. The terminal electrodes 7, 7 of the wireless IC chip 5 are electrically connected to the connection electrodes 22c, 22d via the metal bump 8.

The substantially loop-shaped electrode 22 is provided horizontally in close proximity to an edge portion of the ground electrode 21. The two electrodes are coupled together by an electric field. That is, by placing the substantially loop-shaped electrode 22 in close proximity to the ground electrode on the same plane, the magnetic flux generated perpendicularly or substantially perpendicularly from the substantially loop-shaped electrode 22 becomes substantially symmetrical at the edge portion of the ground electrode 21, so an electric field is generated from the edge portion of the ground electrode 21. An electric field loop is thus excited at the edge portion of the ground electrode 21, and a magnetic field loop produced by this electric field loop spreads out over the entire surface of the ground electrode 21, radiating radio frequency signals into the air. In this way, by arranging the ground electrode 21 and the substantially loop-shaped electrode 22 on the same principal plane in close proximity to each other and in an insulated state, reliable electromagnetic field coupling is established between the two electrodes, thus achieving an improvement in radiation characteristics.

When the substantially loop-shaped electrode 22 is coupled to the ground electrode 21 by an electromagnetic field in this way, a radio frequency signal radiated from the reader/writer and received by the ground electrode 21 is supplied to the wireless IC chip 5 via the substantially loop-shaped electrode 22, causing the wireless IC chip 5 to operate. On the other hand, a response signal from the wireless IC chip 5 is transmitted to the ground electrode 21 via the substantially loop-shaped electrode 22, and radiated to the reader/writer from the ground electrode 21.

The ground electrode 21 used may be an existing electrode provided on the printed wiring circuit board of an electronic apparatus in which this wireless IC device is accommodated. Alternatively, the ground electrode 21 is one used as the ground electrode of another electronic component installed in the electronic apparatus. Therefore, this wireless IC device does not require fabrication of a dedicated antenna, nor does it require a space for its installation. Moreover, the ground electrode 21 preferably has a large size so as to provide improved radiation gain.

Further, the substantially loop-shaped electrode 22 can be adjusted in its length, electrode width, and distance from the ground electrode 21, or the like to achieve proper impedance matching between the wireless IC chip 5 and the ground electrode 21.

Second Preferred Embodiment

Figure 3A:
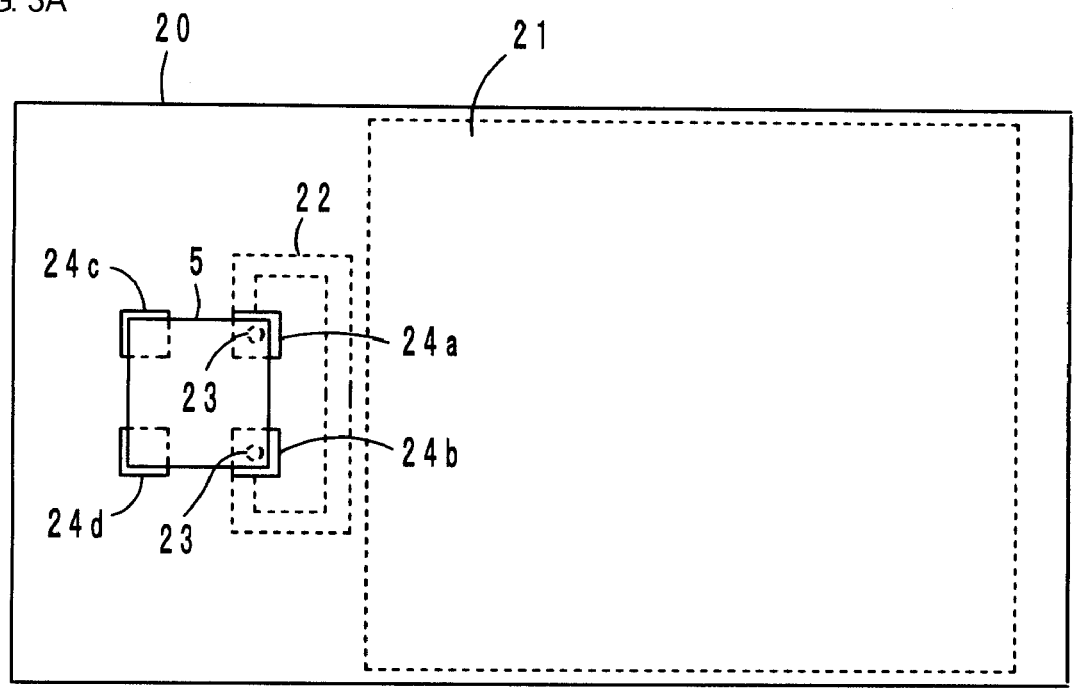
Figure 3B:
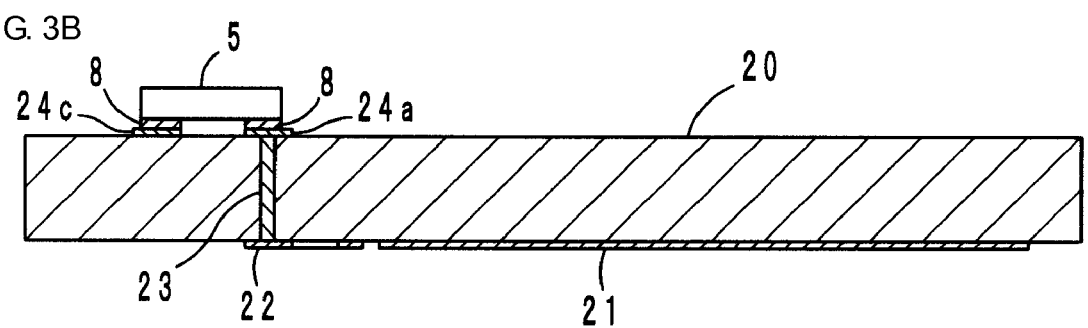

FIGS. 3A and 3B

FIGS. 3A and 3B show a wireless IC device according to a second preferred embodiment of the present invention. This wireless IC device is of basically the same configuration as that of the above-mentioned first preferred embodiment, except that the ground electrode 21 and the substantially loop-shaped electrode 22 are disposed on the back surface of the printed wiring circuit board 20. Connection electrodes 24a to 24d are disposed on the front surface of the circuit board 20. The connection electrodes 24a, 24b are electrically connected to the opposite ends of the substantially loop-shaped electrode 22 via a via-hole conductor 23. The connection electrodes 24a to 24d correspond to the connection electrodes 22a to 22d shown in FIGS. 1A and 1B, and are electrically connected to the terminal electrodes 6, 6, 7, 7 (see FIG. 2) of the wireless IC chip 5 via the metal bump 8.

The coupling state between the ground electrode 21 and the substantially loop-shaped electrode 22 is the same as that of the above-mentioned first preferred embodiment, and the effect of the second preferred embodiment is the same as that of the first preferred embodiment. In particular, it is possible to set a large space for mounting other electronic components on the front surface of the circuit board 20.

Third Preferred Embodiment

Figure 4A:
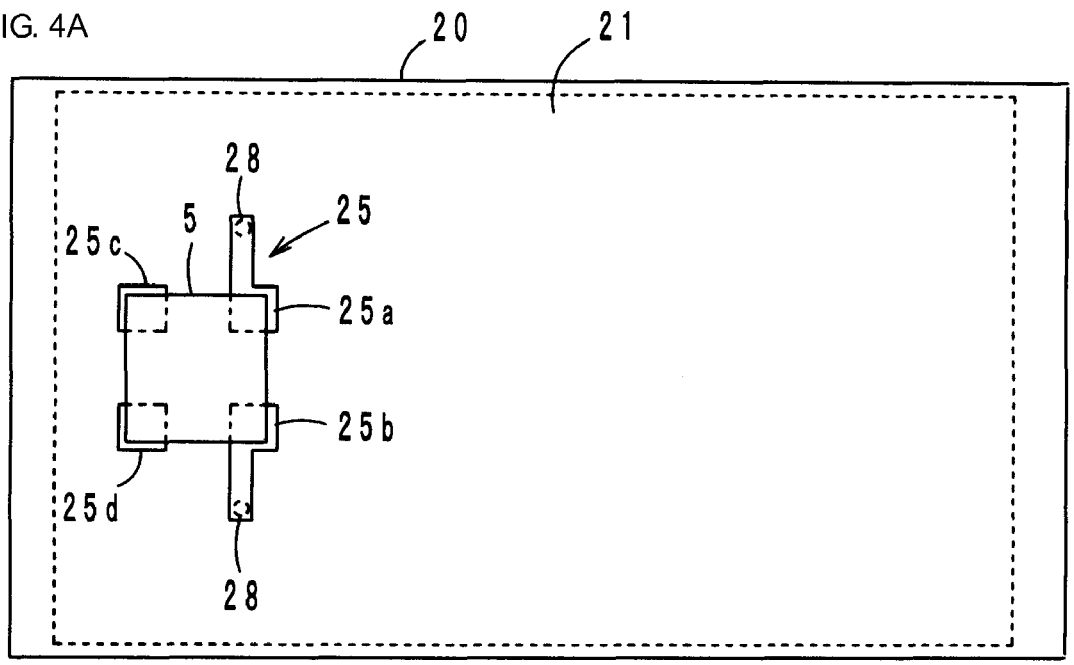
Figure 4B:
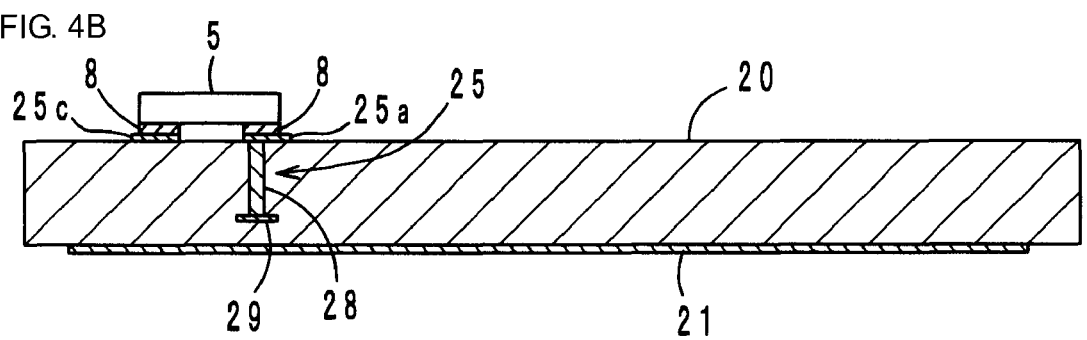
Figure 4C:
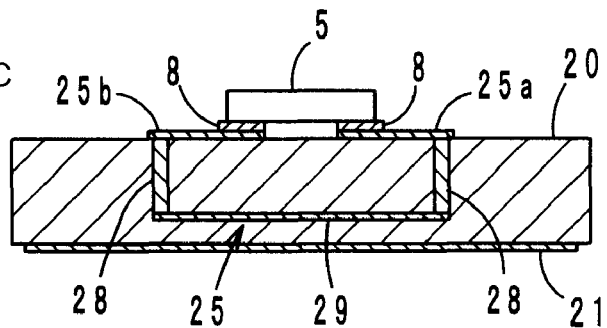

FIGS. 4A to 4C

FIGS. 4A to 4C show a wireless IC device according to a third preferred embodiment of the present invention. In this wireless IC device, a substantially loop-shaped electrode 25 is defined by connection electrodes 25a, 25b provided on the front surface of the printed wiring circuit board 20, via-hole conductors 28, 28, and an internal electrode 29. The substantially loop-shaped electrode 25 is coupled by an electric field to the ground electrode 21 provided on the back surface of the circuit board 20. The connection electrodes 25a, 25b and the connection electrodes 25c, 25d are electrically connected to the terminal electrodes 6, 6, 7, 7 (see FIG. 2) of the wireless IC chip 5 via the metal bump 8.

The substantially loop-shaped electrode 25 is arranged substantially perpendicular and in close proximity to the ground electrode 21, and the two electrodes are coupled to each other by an electric field. That is, the substantially loop-shaped electrode 25 produces a magnetic flux near the plane of the ground electrode 21, and an electric field that is perpendicular or substantially perpendicular to that magnetic field is produced from the ground electrode 21. An electric field loop is thus excited at the ground electrode 21, and a magnetic field loop produced by this electric field loop spreads out over the entire surface of the ground electrode 21, radiating radio frequency signals into the air. In this way, by arranging the substantially loop-shaped electrode 25 substantially perpendicularly in close proximity to the ground electrode 21 and in an insulated state, the degree of freedom in the arrangement of the substantially loop-shaped electrode 25 (that is, the arrangement of the wireless ID chip 5) increases.

The operation of the third preferred embodiment is basically the same as that of the above-mentioned first preferred embodiment. Also, the effect of the third preferred embodiment is as described with reference to the first preferred embodiment. In particular, by forming the substantially loop-shaped electrode 25 in the interior of the printed wiring circuit board 20, disturbance due to an intrusion of external magnetic field or the like decreases. The ground electrode 21 may be disposed in the interior of the circuit board 20. In this case, since a large empty space is created in the front and back surfaces of the circuit board 20, it is possible to increase the integration density by forming another wiring or mounting electronic components in that space.

Fourth Preferred Embodiment

Figure 5A:
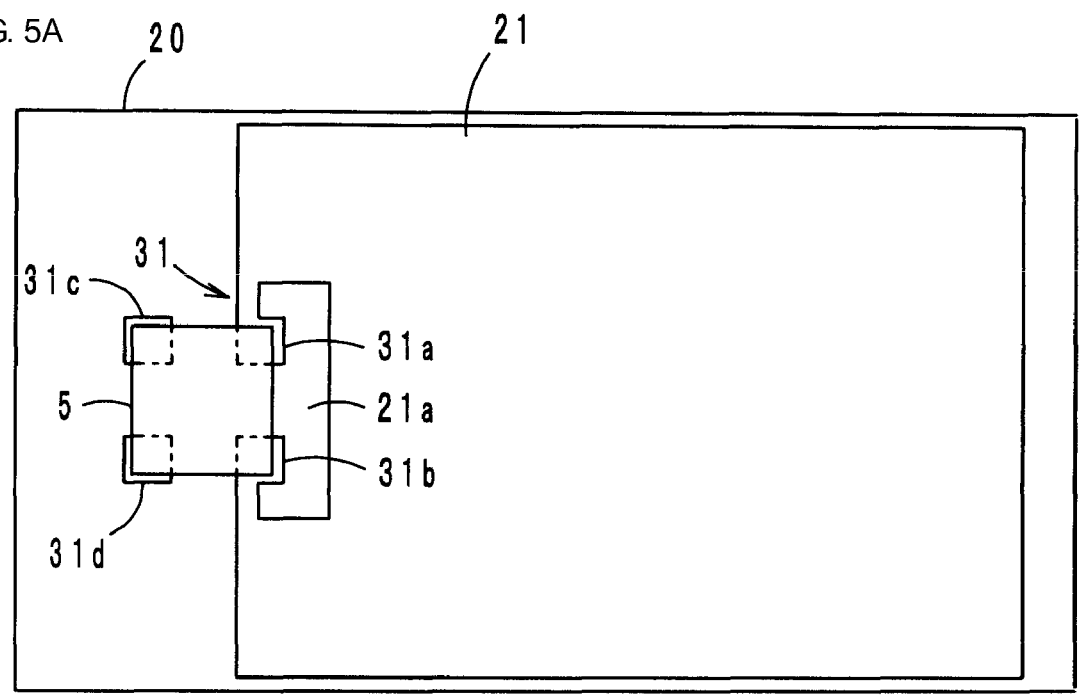
Figure 5B:
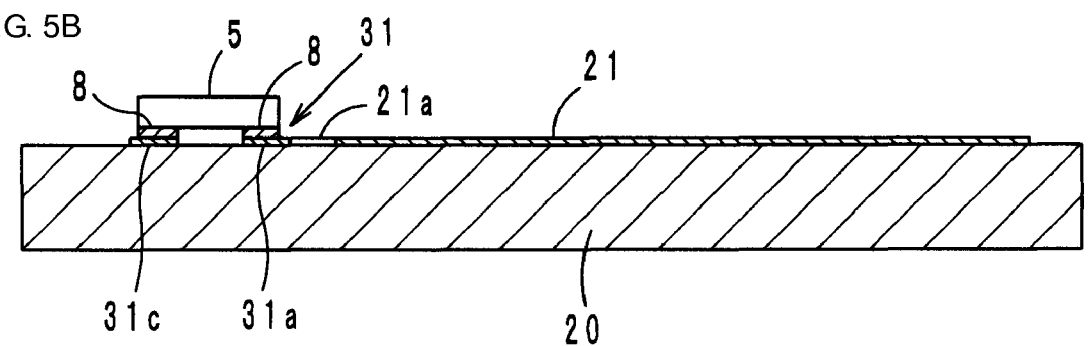

FIGS. 5A and 5B

FIGS. 5A and 5B show a wireless IC device according to a fourth preferred embodiment of the present invention. In this wireless IC device, a substantially loop-shaped electrode 31 is provided by forming a cutout 21a in one side portion of the ground electrode 21 provided on the front surface of the printed wiring circuit board 20, and connection electrodes 31a, 31b are electrically connected to the input/output terminal electrodes 6, 6 (see FIG. 2) of the wireless IC chip 5 via the metal bump 8. Further, connection electrodes 31c, 31d disposed on the front surface of the circuit board 20 are electrically connected to the mounting terminal electrodes 7, 7 of the wireless IC chip 5 via the metal bump 8.

In this fourth preferred embodiment, the substantially loop-shaped electrode 31 is coupled to the ground electrode 21 in an electrically conductive state, and the wireless IC chip 5 and the ground electrode 21 are coupled to each other through the intermediation of the substantially loop-shaped electrode 31. The operation of the fourth preferred embodiment is basically the same as that of the above-mentioned first preferred embodiment. Also, the effects and advantages of the fourth preferred embodiment is as described with reference to the first preferred embodiment.

Fifth Preferred Embodiment

Figure 6A:
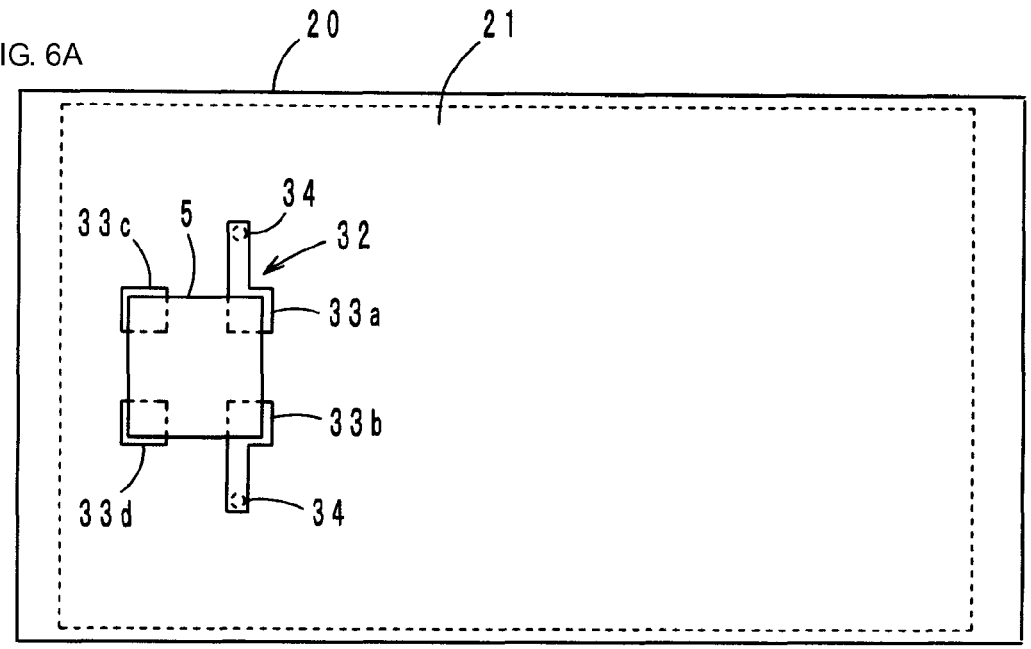
Figure 6B:
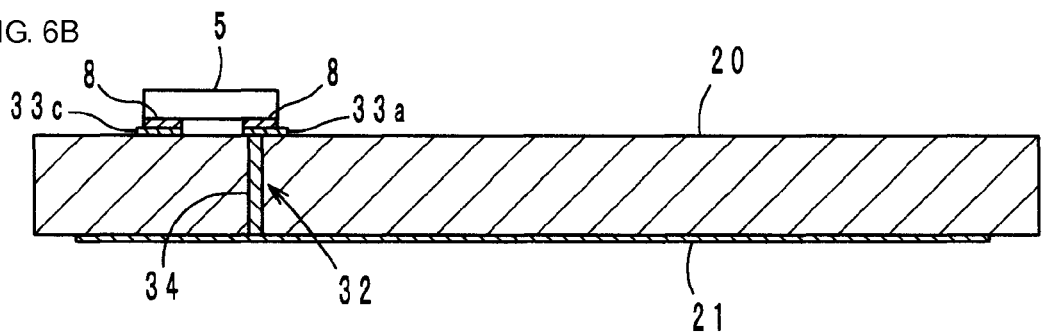
Figure 6C:
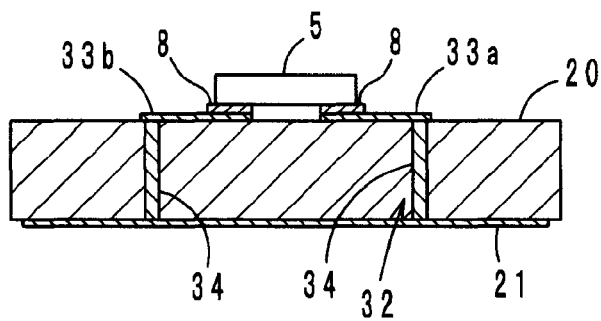

FIGS. 6A to 6C

FIGS. 6A to 6C show a wireless IC device according to a fifth preferred embodiment of the present invention. This wireless IC device is basically the same as that of the above-mentioned fourth preferred embodiment in that the ground electrode 21 and a substantially loop-shaped electrode 32 are coupled to each other in an electrically conductive state. More specifically, the substantially loop-shaped electrode 32 is defined by connection electrodes 33a, 33b provided on the front surface of the printed wiring circuit board 20, and via-hole conductors 34, 34. The ground electrode 21 is disposed on the back surface of the circuit board 20, the upper ends of the via-hole conductors 34, 34 are electrically connected to the connection electrodes 33a, 33b, and the lower ends of the via-hole conductors 34, 34 are electrically connected to the ground electrode 21. The connection electrodes 33a, 33b and the connection electrodes 33c, 33d are electrically connected to the terminal electrodes 6, 6, 7, 7 (see FIG. 2) of the wireless IC chip 5 via the metal bump 8.

In this fifth preferred embodiment, the substantially loop-shaped electrode 32 is coupled to the ground electrode 21 in an electrically conductive state, and the wireless IC chip 5 and the ground electrode 21 are coupled to each other through the intermediation of the substantially loop-shaped electrode 32. The operation of the fifth preferred embodiment is basically the same as that of the above-mentioned first preferred embodiment. Also, the effect of the fifth preferred embodiment is as described with reference to the first preferred embodiment.

Sixth Preferred Embodiment

Figure 7A:
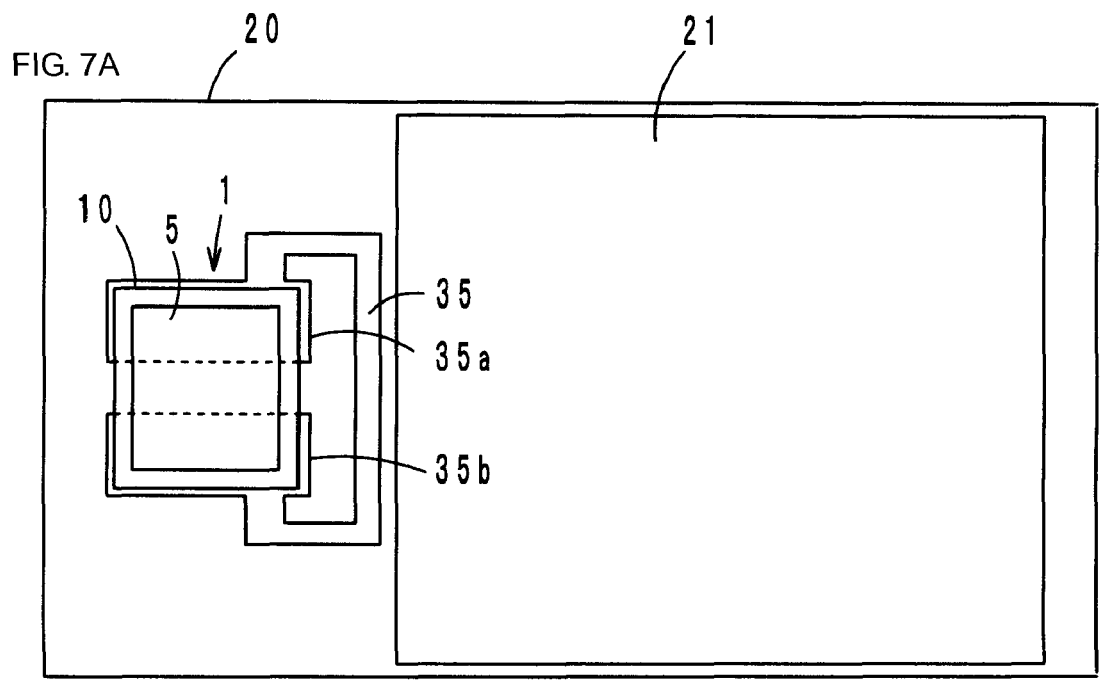
Figure 7B:
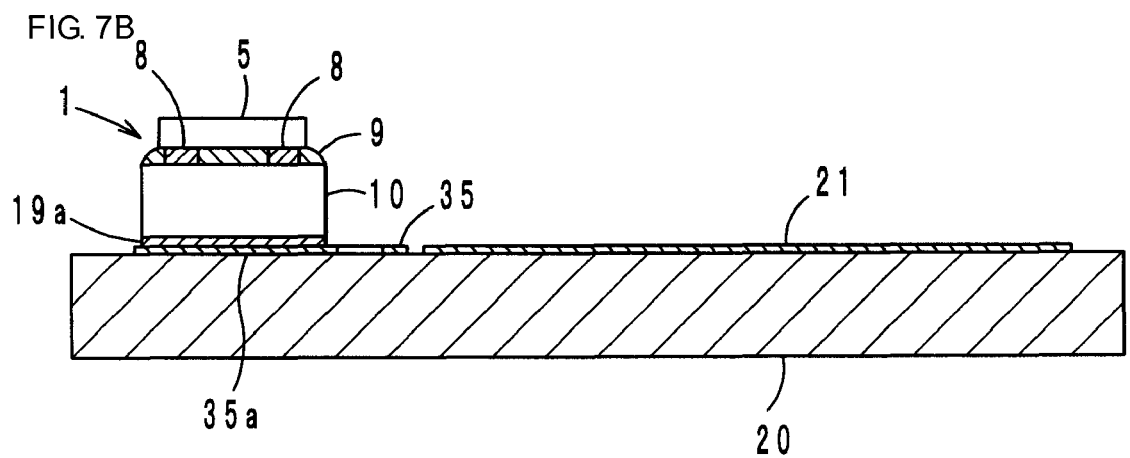

FIGS. 7A and 7B

FIGS. 7A and 7B show a wireless IC device according to a sixth preferred embodiment of the present invention. In this wireless IC device, the wireless IC chip 5 is installed on a feeder circuit board 10 to define an electromagnetic coupling module 1, and the electromagnetic coupling module 1 is electrically connected to a substantially loop-shaped electrode 35 provided on the printed wiring circuit board 20. Like the substantially loop-shaped electrode 22 described with reference to the above-mentioned first preferred embodiment, the substantially loop-shaped electrode 35 is arranged in close proximity to the ground electrode 21 provided on the front surface of the circuit board 20, and is coupled to the ground electrode 21 by a magnetic field.

In the wireless IC chip 5, the input/output terminal electrodes 6, 6 shown in FIG. 2 are electrically connected to electrodes 12a, 12b (see FIGS. 9 and 10) provided on the front surface of the feeder circuit board 10 via the metal bump 8, and the mounting terminal electrodes 7, 7 are electrically connected to electrodes 12c, 12d via the metal bump 8. Further, between the front surface of the feeder circuit board 10 and the back surface of the wireless IC chip 5, there is provided a protective film 9 that also provides an effect of enhancing the bonding strength between the feeder circuit board 10 and the wireless IC chip 5.

The feeder circuit board 10 has a built-in resonant circuit (not shown in FIGS. 7A and 7B) having an inductance element. The feeder circuit board 10 has external electrodes 19a, 19b (see FIGS. 9 and 10) provided on its back surface, and the connection electrodes 12a to 12d (see FIGS. 9 and 10) provided on its front surface. The external electrodes 19a, 19b are coupled by an electromagnetic field to the resonant circuit built in the board 10, and are connected to connection electrodes 35a, 35b of the substantially loop-shaped electrode 35 in an electrically conductive state via a conductive adhesive (not shown). Solder or the like may be used for this electrical connection.

That is, a resonant circuit having a predetermined resonance frequency is built in the feeder circuit board 10, and transmission signals originated from the wireless IC chip 5 and having a predetermined frequency are transmitted to the ground electrode 21 via the external electrodes 19a, 19b and the substantially loop-shaped electrode 35, and a reception signal having a predetermined frequency is selected from among signals received by the ground electrode 21 and is supplied to the wireless IC chip 5. Hence, in this wireless IC device, the wireless IC chip 5 is operated by a signal received by the ground electrode 21, and a response signal from the wireless IC chip 5 is radiated to the outside from the ground electrode 21.

In the electromagnetic coupling module 1 mentioned above, the external electrodes 19a, 19b provided on the back surface of the feeder circuit board 10 are coupled by an electromagnetic field to the resonant circuit built in the board 10, and are also electrically conducted to the substantially loop-shaped electrode 35 that is coupled by an electric field to the ground electrode 21 that functions as an antenna. Since the electromagnetic coupling module 1 does not need to be installed with an antenna element which is relatively large in size as a separate part, the electromagnetic coupling module 1 can be reduced in size. Since the feeder circuit board 10 is also reduced in size, the wireless IC chip 5 may simply be installed on the feeder circuit board 10 thus reduced in size, which allows use of an IC mounting device or the like widely used in the related art, leading to a reduction in mounting cost. Further, the frequency band to be used can be changed by simply changing the design of the resonant circuit.

Only an inductance element may be formed as an element formed within the feeder circuit board 10. The inductance element provides a function of matching the impedance between the wireless IC chip 5 and the radiator plate (ground electrode 21).

Seventh Preferred Embodiment

Figure 8A:
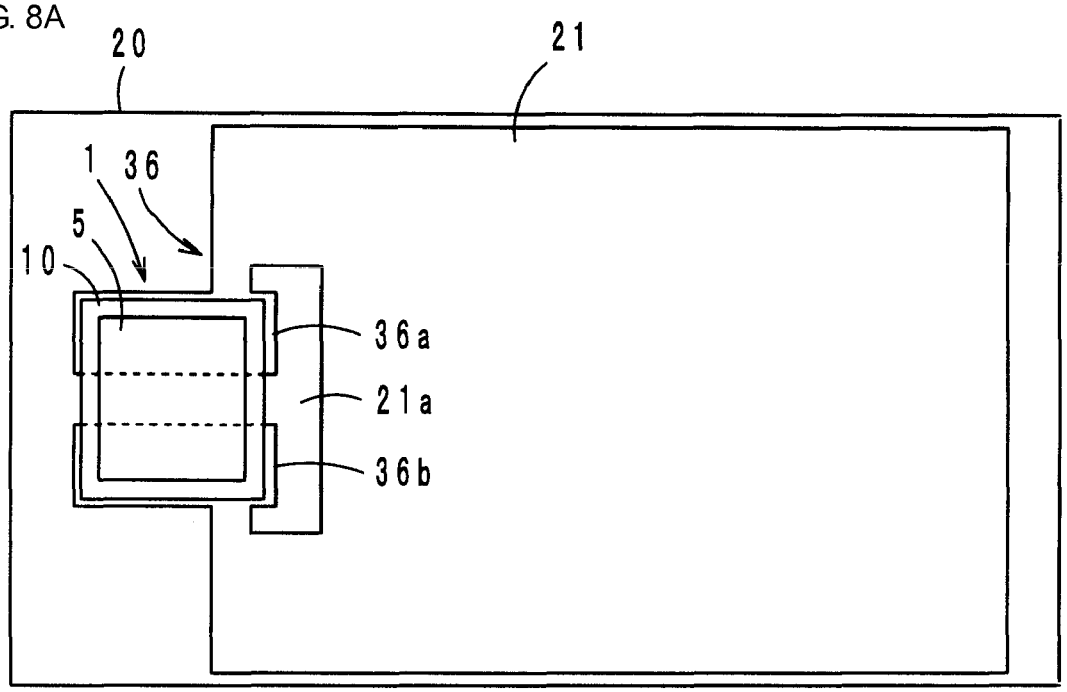
Figure 8B:
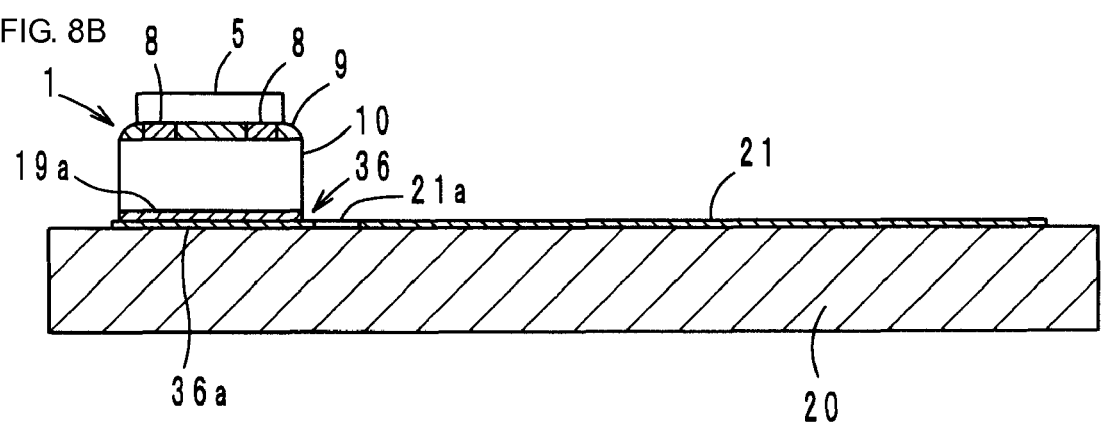

FIGS. 8A and 8B

FIGS. 8A and 8B show a wireless IC device according to a seventh preferred embodiment of the present invention. In this wireless IC device, as in the sixth preferred embodiment mentioned above, the wireless IC chip 5 is installed on the feeder circuit board 10 to define the electromagnetic coupling module 1, and the electromagnetic coupling module 1 is electrically connected to a substantially loop-shaped electrode 36 provided on the printed wiring circuit board 20. Like the substantially loop-shaped electrode 31 described with reference to the fourth preferred embodiment mentioned above, the substantially loop-shaped electrode 36 is prepared by forming the cutout 21a in one side portion of the ground electrode 21, and has connection electrodes 36a, 36b connected to the external electrodes 19a, 19b, which are provided on the back surface of the feeder circuit board 10, in an electrically conductive state via a conductive adhesive (not shown). It should be noted that the configuration and effects of the feeder circuit board 10 in the seventh preferred embodiment are the same as those in the above-mentioned sixth preferred embodiment, and the effects and advantages of the substantially loop-shaped electrode 36 is the same as that of the above-mentioned fourth embodiment.

Figure 9:
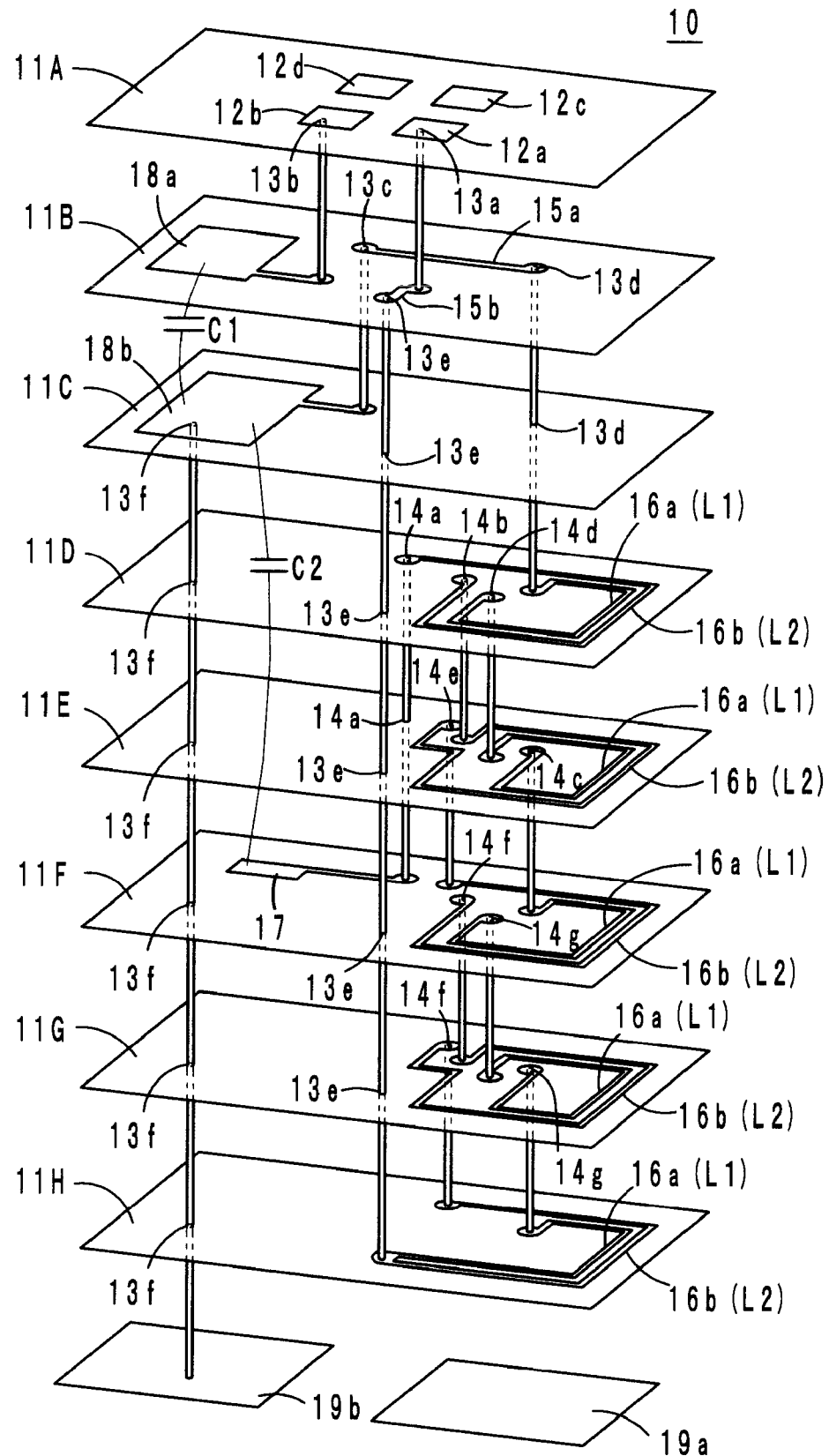
FIG. 9 is a perspective view showing a feeder circuit board having a first example of a resonant circuit built therein.

First Example of Resonant Circuit (FIG. 9)

A first example of a resonant circuit built in the feeder circuit board 10 is shown in FIG. 9. The feeder circuit board 10 is formed by laminating, pressure-bonding, and firing ceramic sheets 11A to 11H each made of a dielectric. The connection electrodes 12a, 12b, the electrodes 12c, 12d, and via-hole conductors 13a, 13b are disposed in the sheet 11A, a capacitor electrode 18a, conductor patterns 15a, 15b, and via-hole conductors 13c to 13e are formed in the sheet 11B, and a capacitor electrode 18b and via-hole conductors 13d to 13f are disposed in the sheet 11C. Further, conductor patterns 16a, 16b and via-hole conductors 13e, 13f, 14a, 14b, 14d are disposed in the sheet 11D, conductor patterns 16a, 16b and via-hole conductors 13e, 13f, 14a, 14c, 14e are disposed in the sheet 11E, a capacitor electrode 17, conductor patterns 16a, 16b, and via-hole conductors 13e, 13f, 14f, 14g are disposed in the sheet 11F, conductor patterns 16a, 16b and via-hole conductors 13e, 13f, 14f, 14g are disposed in the sheet 11G, and conductor patterns 16a, 16b and via-hole 13f are disposed in the sheet 11H.

Upon laminating the above-mentioned sheets 11A to 11H together, an inductance element L1 is defined by the conductor patterns 16a connected in a spiral manner by the via-hole conductors 14c, 14d, 14g, an inductance element L2 is defined by the conductor patterns 16b connected in a spiral manner by the via-hole conductors 14b, 14e, 14f, a capacitance element C1 is defined by the capacitor electrodes 18a, 18b, and a capacitance element C2 is defined by the capacitor electrodes 18a, 17.

One end of the inductance element L1 is connected to the capacitor electrode 18b via the via-hole 13d, the conductor pattern 15a, and the via-hole conductor 13c, and one end of the inductance element L2 is connected to the capacitor electrode 17 via the via-hole conductor 14a. The other ends of the inductance elements L1, L2 are combined together on the sheet 11H, and connected to the connection electrode 12a via the via-hole conductor 13e, the conductor pattern 15b, and the via-hole conductor 13a. Further, the capacitor electrode 18a is electrically connected to the connection electrode 12b via the via-hole conductor 13b.

The connection electrodes 12a, 12b are electrically connected to the terminal electrodes 6, 6 of the wireless IC chip 5 via the metal bump 8. The electrodes 12c, 12d are connected to the terminal electrodes 7, 7 of the wireless IC chip 5.

The external electrodes 19a, 19b are provided on the back surface of the feeder circuit board 10 by application of a conductive paste or the like. The external electrode 19a is coupled to the inductance elements (L1, L2) by a magnetic field, and the external electrode 19b is electrically connected to the capacitor electrode 18b via the via-hole conductor 13f. As described above, the external electrodes 19a, 19b are electrically connected to the connection electrodes 35a, 35b or 36a, 36b of the substantially loop-shaped electrode 35 or 36.

In this resonant circuit, the structure of the inductance elements L1, L2 is such that two conductor patterns 16a, 16b are arranged in parallel or substantially in parallel. The two conductor patterns 16a, 16b have different line lengths to provide different resonance frequencies, thereby making it possible to increase the frequency bandwidth of the wireless IC device.

The ceramic sheets 11A to 11H may be made of a magnetic ceramic material. The feeder circuit board 10 can be easily obtained by a multilayer board fabrication process such as sheet lamination or thick film printing used in the related art.

A configuration may be adopted in which the sheets 11A to 11H are formed as flexible sheets made of a dielectric such as polyimide or liquid crystal polymer, for example, electrodes and conductors are formed on the sheets by thick film formation or the like, and these sheets are laminated into a laminate by thermal compression bonding or the like, thus forming a structure with the inductance elements L1, L2 and the capacitance elements C1, C2 built in.

In the feeder circuit board 10, the inductance elements L1, L2 and the capacitance elements C1, C2 are provided at different positions as seen in plan view. The feeder circuit board 10 is coupled via a magnetic field to the external electrode 19a by the inductance elements L1, L2, and the external electrode 19b serves as one electrode constituting the capacitance element C1.

Therefore, in the electromagnetic coupling module 1 having the wireless IC chip 5 installed on the feeder circuit board 10, a radio frequency signal (in a UHF frequency band, for example) radiated from the reader/writer (not shown) is received by the ground electrode 21, the resonant circuit that is coupled by magnetic and electric fields to the external electrodes 19a, 19b via the substantially loop-shaped electrode 35 or 36 is resonated, and only a reception signal in a predetermined frequency band is supplied to the wireless IC chip 5. On the other hand, predetermined energy is extracted from this reception signal, and with this energy as a driving source, information stored in the wireless IC chip 5 is sent to the ground electrode 21 via the external electrodes 19a, 19b and the substantially loop-shaped electrode 35 or 36 after being matched to a predetermined frequency by the resonant circuit, and then transmitted and transferred to the reader/writer from the ground electrode 21.

In the feeder circuit board 10, the resonance frequency characteristics are determined by the resonant circuit defined by the inductance elements L1, L2 and the capacitance elements C1, C2. The resonance frequency of a signal radiated from the ground electrode 21 is substantially determined by the self-resonant frequency of the resonant circuit.

Incidentally, the resonant circuit also serves as a matching circuit for matching the impedance of the wireless IC chip 5 with the impedance of the ground electrode 21. The feeder circuit board 10 may include a matching circuit provided separately from the resonant circuit defined by the inductance elements and the capacitance elements (In this sense, the resonant circuit is also referred to as the matching circuit). Adding a matching circuit function to the resonant circuit tends to result in increasing complexity of the design of the resonant circuit. If a matching circuit is provided separately from the resonant circuit, the resonant circuit and the matching circuit can be designed independently from each other. It should be noted that the substantially loop-shaped electrodes 35, 36 may be endowed with an impedance matching function or a function as a resonant circuit. In that case, an improvement in radiation characteristics can be achieved by designing the resonant circuit (matching circuit) within the feeder circuit board 10 while also taking such factors as the configuration of the substantially loop-shaped electrode, and the size of the ground electrode serving as a radiator plate into consideration.

Figure 10:
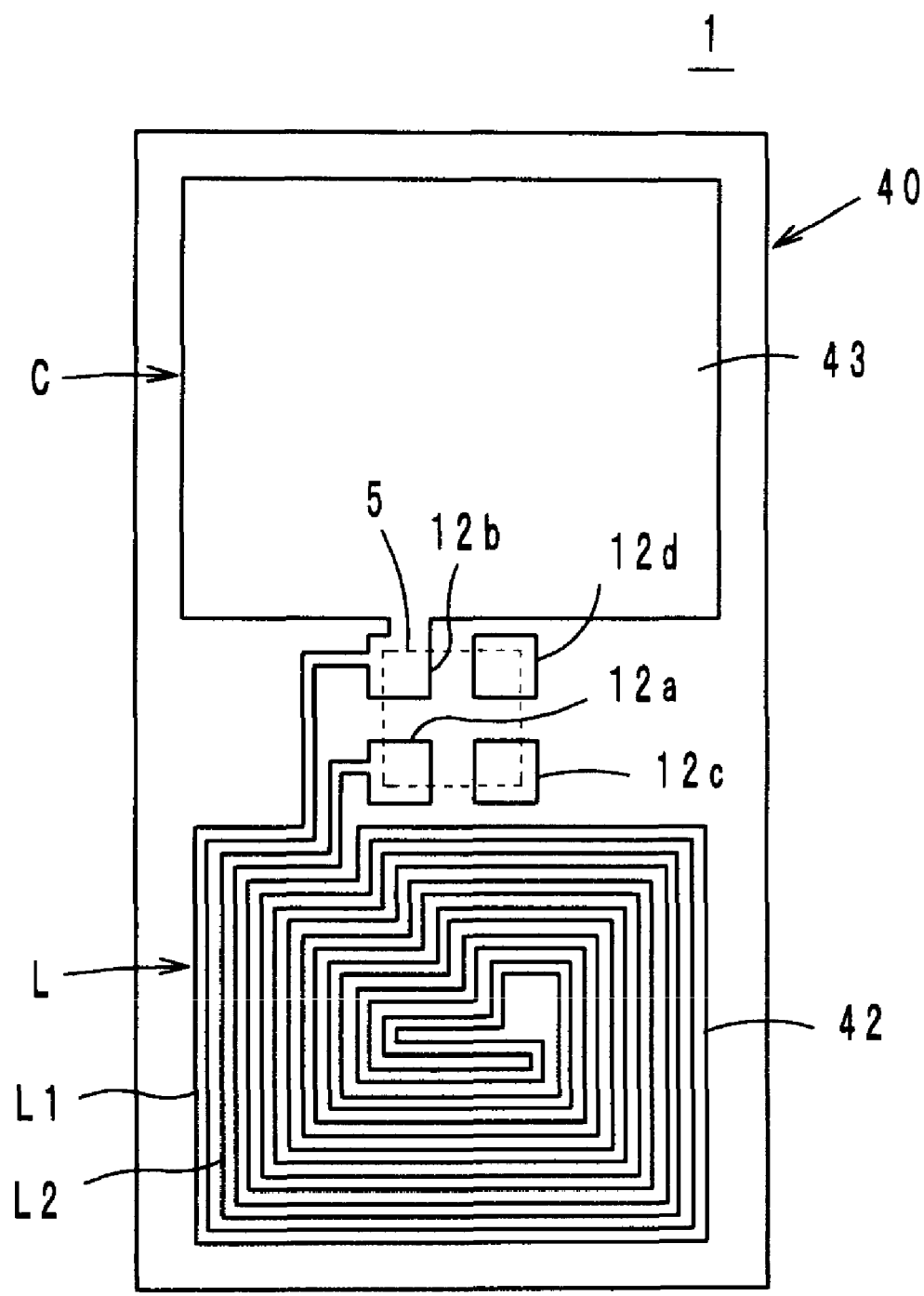
FIG. 10 is a plan view showing a feeder circuit board in which a second example of a resonant circuit is provided.

Second Example of Resonant Circuit (FIG. 10)

A second example of the resonant circuit provided in a feeder circuit board 40 is shown in FIG. 10. The feeder circuit board 40 is preferably made of a flexible PET film or the like. A substantially spiral conductor pattern 42 constituting an inductance element L, and a capacitor electrode 43 constituting a capacitance element C are disposed on the board 40. The electrodes 12a, 12b led out from the conductor pattern 42 and the capacitor electrode 43 are electrically connected to the terminal electrodes 6, 6 of the wireless IC chip 5. The electrodes 12c, 12d disposed on the board 40 are electrically connected to the terminal electrodes 7, 7 of the wireless IC chip 5.

The feeder circuit board 40 is the same as that of the above-mentioned first example in that the inductance element L and the capacitance element C constitute a resonant circuit, and that magnetic-field coupling or electric-field coupling is established between the electrodes 35a, 35b or the electrodes 36a, 36b that are opposed to each other to thereby transmit/receive a radio frequency signal having a predetermined frequency. In particular, since the feeder circuit board 40 is made of a flexible film according to the second example, the height of the electromagnetic coupling module 1 is reduced. Further, as for the inductance element L, its inductance value is varied by varying the line width or line interval of the conductor pattern 42, thus enabling fine adjustment of the resonance frequency.

In the second example as well, the inductance element L is defined by two conductor patterns 42 arranged in a substantially spiral manner, and connecting the two conductor patterns 42 together at the center portion of the spiral. The two conductor patterns 42 have different inductance values L1, L2, and can be set to have different resonance frequency values, thereby making it possible to increase the frequency bandwidth of the wireless IC device as in the first embodiment mentioned above.

Figure 11:
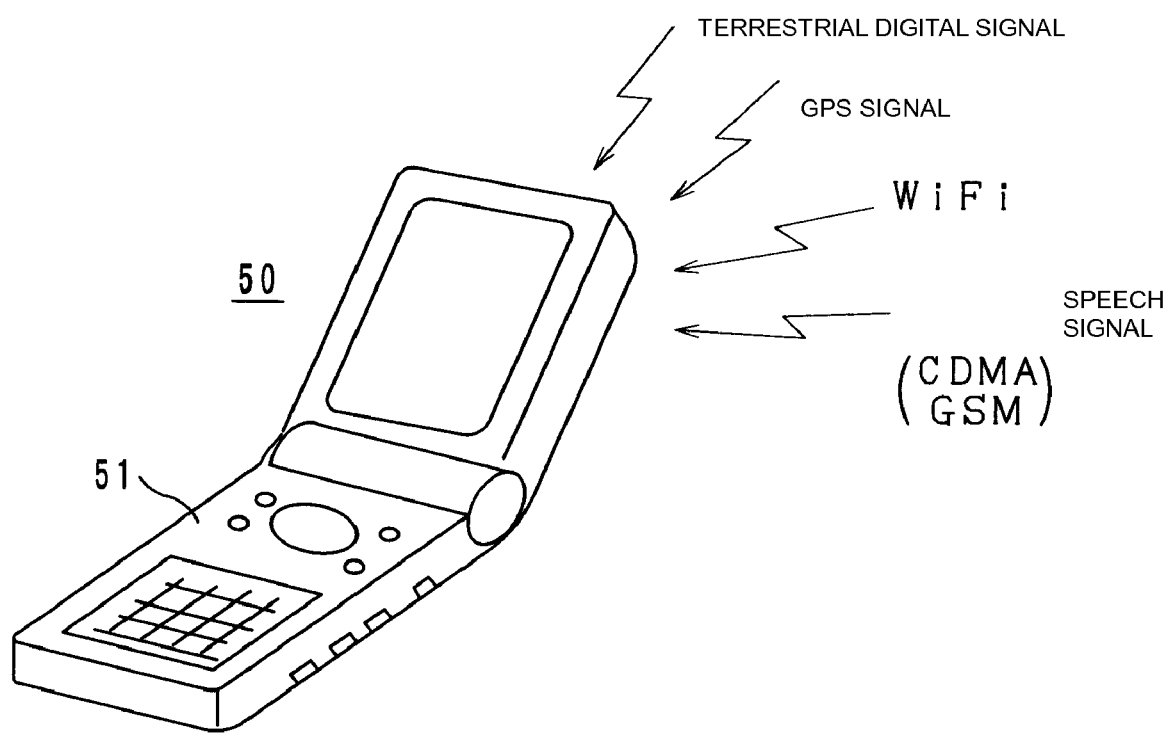
FIG. 11 is a perspective view showing a portable telephone as an electronic apparatus according to a preferred embodiment of the present invention.
Figure 12:
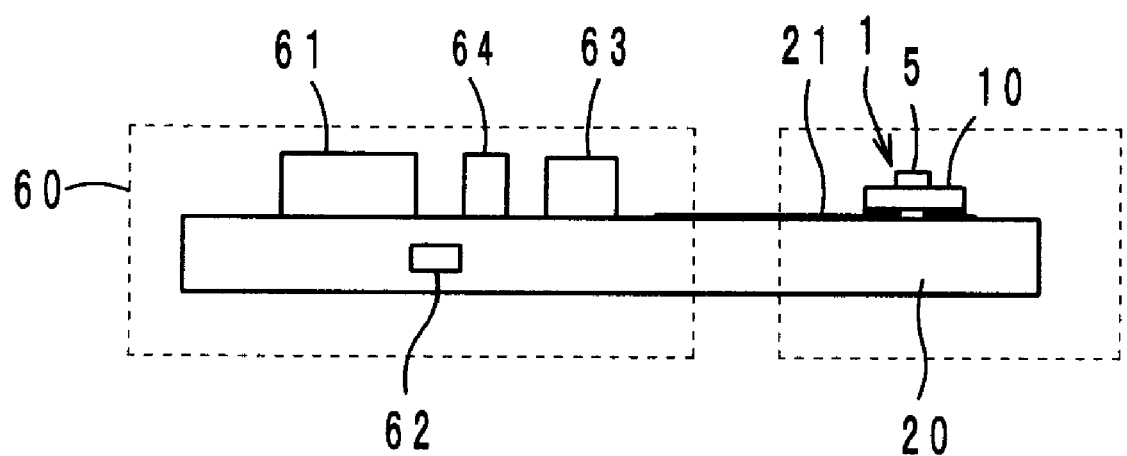
FIG. 12 is an explanatory view showing a printed wiring circuit board built in a portable telephone.

Preferred Embodiment of Electronic Apparatus (FIGS. 11 and 12)

Next, a portable telephone will be described as an electronic apparatus according to a preferred embodiment of the present invention. A portable telephone 50 shown in FIG. 11 operates on a plurality of frequencies, and receives inputs of a terrestrial digital signal, a GPS signal, a WiFi signal, and a speech signal such as CDMA or GSM.

As shown in FIG. 12, the printed wiring circuit board 20 is installed within a housing 51. A radio communication circuit 60 and the electromagnetic coupling module 1 are arranged on the printed wiring circuit board 20. The radio communication circuit 60 includes an IC 61, a balun 62 built in the circuit board 20, a BPF 63, and a capacitor 64. The feeder circuit board 10 with the wireless IC chip 5 installed is installed on the substantially loop-shaped electrode (which is indicated by reference numeral 35 in the sixth preferred embodiment, and indicated by reference numeral 36 in the seventh preferred embodiment) coupled to the ground electrode 21 provided on the printed wiring circuit board 20, thereby defining a wireless IC device.

Other Preferred Embodiments

It is to be understood that the wireless IC device and the electronic apparatus according to the present invention are not limited to those of the above-mentioned preferred embodiments, and can be modified in a variety of ways within the scope of the present invention.

For example, it is needless to mention that resonant circuits of various configurations can be adopted as the resonant circuit. Further, the materials of the external electrode and feeder circuit board exemplified in the above-mentioned preferred embodiments are only examples, and any arbitrary material having requisite characteristics can be used. Further, a process other than that using a metal bump may be used for mounting the wireless IC chip on the feeder circuit board.

Further, the apparatus on which the electromagnetic coupling module 1 is to be mounted is not limited to a radio communication apparatus such as a portable telephone, but may be various kinds of apparatus including a circuit board having a ground electrode (for example, household electric products such as a TV or refrigerator).

While preferred embodiments of the present invention have been described above, it is to be understood that variations and modifications will be apparent to those skilled in the art without departing the scope and spirit of the present invention. The scope of the invention, therefore, is to be determined solely by the following claims.

What is claimed is:

1. A wireless IC device comprising:
   a wireless IC chip arranged to process a transmission/reception signal;
   a circuit board on which the wireless IC chip is mounted;
   a ground electrode disposed on the circuit board; and
   a substantially loop-shaped electrode that is electrically conducted to the wireless IC chip, and disposed on the circuit board so as to be electromagnetically coupled to the ground electrode; wherein
   the substantially loop-shaped electrode has an impedance matching function;
   the ground electrode is arranged to receive a radio frequency signal and to radiate a response signal from the wireless IC chip; and
   the substantially loop-shaped electrode is arranged to transmit the radio frequency signal received by the ground electrode to the wireless IC chip and to transmit the response signal from the wireless IC chip to the ground electrode.

2. The wireless IC device according to claim 1, wherein the substantially loop-shaped electrode and the ground electrode are disposed on the same principal surface of the circuit board.

3. The wireless IC device according to claim 1, wherein at least one of the substantially loop-shaped electrode and the ground electrode is disposed in an inner portion of the circuit board.

4. The wireless IC device according to claim 1, wherein the substantially loop-shaped electrode and the ground electrode are arranged in a state insulated from each other.

5. The wireless IC device according to claim 1, wherein the substantially loop-shaped electrode and the ground electrode are arranged in a state electrically conductive to each other.

6. The wireless IC device according to claim 1, wherein the substantially loop-shaped electrode includes an impedance matching function.

7. An electronic apparatus comprising the wireless IC device according to claim 1.

8. A wireless IC device comprising:
   an electromagnetic coupling module having a wireless IC chip arranged to process a transmission/reception signal, and a feeder circuit board including an inductance element, the inductance element being connected to the wireless IC chip in an electrically conductive state;
   a circuit board on which the electromagnetic coupling module is mounted;
   a ground electrode disposed on the circuit board; and
   a substantially loop-shaped electrode that is electrically conducted to the feeder circuit board, and disposed on the circuit board so as to be electromagnetically coupled to the ground electrode; wherein
   the substantially loop-shaped electrode has an impedance matching function;
   the ground electrode is arranged to receive a radio frequency signal and to radiate a response signal from the wireless IC chip; and
   the substantially loop-shaped electrode is arranged to transmit the radio frequency signal received by the ground electrode to the wireless IC chip and to transmit the response signal from the wireless IC chip to the ground electrode.

9. The wireless IC device according to claim 8, further comprising a resonant circuit disposed in the feeder circuit board.

10. The wireless IC device according to claim 9, further comprising an external electrode disposed on a surface of the feeder circuit board, the external electrode being coupled by an electromagnetic field to the resonant circuit and electrically conducted to the substantially loop-shaped electrode.

11. The wireless IC device according to claim 8, further comprising a matching circuit disposed in the feeder circuit board.

12. The wireless IC device according to claim 11, further comprising an external electrode disposed on a surface of the feeder circuit board, the external electrode being coupled by an electromagnetic field to the matching circuit and electrically conducted to the substantially loop-shaped electrode.

13. The wireless IC device according to claim 8, wherein the feeder circuit board is defined by a multilayer board.

14. The wireless IC device according to claim 8, wherein the feeder circuit board is defined by a flexible board.

15. A wireless IC device comprising:
    a wireless IC chip arranged to process a transmission/reception signal;
    a circuit board on which the wireless IC chip is mounted;
    a ground electrode disposed on the circuit board; and
    a substantially loop-shaped electrode that is electrically conducted to the wireless IC chip, and disposed on the circuit board so as to be electrically connected to the ground electrode; wherein
    the substantially loop-shaped electrode has an impedance matching function;
    the ground electrode is arranged to receive a radio frequency signal and to radiate a response signal from the wireless IC chip; and
    the substantially loop-shaped electrode is arranged to transmit the radio frequency signal received by the ground electrode to the wireless IC chip and to transmit the response signal from the wireless IC chip to the ground electrode.

16. A wireless IC device comprising:
    an electromagnetic coupling module having a wireless IC chip arranged to process a transmission/reception signal, and a feeder circuit board including an inductance element, the inductance element being connected to the wireless IC chip in an electrically conductive state;

a circuit board on which the electromagnetic coupling module is mounted;

a ground electrode disposed on the circuit board; and a substantially loop-shaped electrode that is electrically conducted to the feeder circuit board, and disposed on the circuit board so as to be electrically connected to the ground electrode; wherein the substantially loop-shaped electrode has an impedance matching function;

the ground electrode is arranged to receive a radio frequency signal and to radiate a response signal from the wireless IC chip; and the substantially loop-shaped electrode is arranged to transmit the radio frequency signal received by the ground electrode to the wireless IC chip and to transmit the response signal from the wireless IC chip to the ground electrode.

* * * * *